United States Patent
Khoshkava et al.

(10) Patent No.: US 10,303,253 B2
(45) Date of Patent: May 28, 2019

(54) DISPLAY DEVICE WITH LOCALIZED HAPTIC EFFECT

(71) Applicant: Immersion Corporation, San Jose, CA (US)

(72) Inventors: Vahid Khoshkava, Montreal (CA); Neil T. Olien, Montreal (CA); Juan Manuel Cruz-Hernandez, Montreal (CA)

(73) Assignee: IMMERSION CORPORATION, San Jose, CA (US)

( * ) Notice: Subject to any disclaimer, the term of this patent is extended or adjusted under 35 U.S.C. 154(b) by 0 days.

(21) Appl. No.: 15/621,202

(22) Filed: Jun. 13, 2017

(65) Prior Publication Data

US 2018/0356889 A1    Dec. 13, 2018

(51) Int. Cl.
| | |
|---|---|
| *G06F 3/01* | (2006.01) |
| *G06F 3/044* | (2006.01) |
| *G06F 3/041* | (2006.01) |
| *H01L 27/32* | (2006.01) |
| *G02F 1/1333* | (2006.01) |

(52) U.S. Cl.
CPC .............. *G06F 3/016* (2013.01); *G06F 3/044* (2013.01); *G06F 3/0412* (2013.01); *G02F 1/13338* (2013.01); *G06F 2203/04103* (2013.01); *H01L 27/323* (2013.01)

(58) Field of Classification Search
CPC ...... G06F 3/016; G06F 3/0412; G06F 3/0414; G06F 3/044; G06F 2203/04103; G02F 1/13338; H01L 27/323
See application file for complete search history.

(56) References Cited

U.S. PATENT DOCUMENTS

| | | | |
|---|---|---|---|
| 8,390,594 B2 | 3/2013 | Modarres et al. | |
| 8,878,806 B2 | 11/2014 | Modarres et al. | |
| 9,671,865 B2 | 6/2017 | Modarres et al. | |
| 9,799,279 B1* | 10/2017 | Evans, V | H04N 1/00411 |
| 2011/0261021 A1 | 10/2011 | Modarres et al. | |
| 2012/0086651 A1 | 4/2012 | Kwon et al. | |
| 2014/0140551 A1 | 5/2014 | Ramstein | |
| 2016/0274724 A1* | 9/2016 | Chang | G06F 3/0416 |

(Continued)

OTHER PUBLICATIONS

European Search Report issued in European Application No. 18177297, dated Oct. 10, 2018.

*Primary Examiner* — Tom V Sheng
(74) *Attorney, Agent, or Firm* — Medler Ferro Woodhouse & Mills PLLC

(57) ABSTRACT

A haptic-enabled display device is presented. The haptic-enabled device has a display layer, a first electrode layer, an actuation layer, and an electrode patch. The first electrode layer is disposed on the display layer. The actuation layer is formed of a single piece of actuatable material. A first side of the actuation layer is disposed on the first electrode layer. The single piece of actuatable material of the actuation layer and the conductive material of the first electrode layer may have substantially the same area. The electrode patch may form a second electrode layer, and may be disposed on a second and opposite side of the actuation layer. The electrode patch is electrically connected to a region of the actuatable material, and has an area that is smaller than that of the single piece of actuatable material and smaller than that of the conductive material of the first electrode layer.

24 Claims, 13 Drawing Sheets

(56) References Cited

U.S. PATENT DOCUMENTS

2017/0102820 A1\* 4/2017 Yu .......................... G06F 3/0416
2018/0052550 A1\* 2/2018 Zhang ..................... G06F 3/016
2018/0164888 A1\* 6/2018 Ham ................... H01L 41/0477

\* cited by examiner

DISPLAY DEVICE WITH LOCALIZED HAPTIC EFFECT

FIELD OF THE INVENTION

The present invention is directed to a display device with the ability to provide a localized haptic effect, and has application in user interfaces, gaming, automotive, wearable devices, and consumer electronics.

BACKGROUND

Electronic device manufacturers strive to produce a rich interface for users. Many devices use visual and auditory cues to provide feedback to a user. In some interface devices, a tactile effect (such as vibration, texture, and heat) are also provided to the user. Such tactile effects may more generally be referred to as "haptic feedback" or "haptic effects". Haptic feedback can provide cues that enhance and simplify the user interface. For example, vibration or deformation effects may be useful in providing cues to users of electronic devices to alert the user to specific events, or provide realistic feedback to create greater sensory immersion within a simulated or virtual environment.

To generate a haptic effect, many devices use an actuator. Example actuators for generating a haptic effect (also referred to as a haptic actuator) include an electromagnetic actuator such as an eccentric rotating mass ("ERM") actuator and a linear resonant actuator ("LRA"). Other actuators include actuators that use a "smart material," such as a piezoelectric material, an electro-active polymer, or a shape memory alloy.

SUMMARY

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

One aspect of the embodiments herein relate to a haptic-enabled display device comprising a display layer, a first electrode layer, an actuation layer, an electrode patch, and a control unit. The first electrode layer is formed of conductive material disposed on the display layer. The actuation layer is formed of a single piece of actuatable material. A first side of the actuation layer is disposed on and electrically connected to the first electrode layer, wherein the single piece of actuatable material of the actuation layer and the conductive material of the first electrode layer have substantially the same area. The electrode patch forms a second electrode layer and is disposed on a second and opposite side of the actuation layer, wherein the electrode patch is electrically connected to a region of the actuatable material, and has an area that is smaller than that of the single piece of actuatable material and smaller than that of the conductive material of the first electrode layer. The control unit is configured to provide a haptic driving signal to the electrode patch to actuate the region of the actuatable material at which the electrode patch is disposed. The actuatable material is configured to deform at the region at which the electrode patch is disposed upon the haptic driving signal creating a difference in electrical potential between the first and second sides of the actuation layer at the region.

In an embodiment, the electrode patch is a first electrode patch, and the region at which the electrode patch is disposed is a first region. The second electrode layer includes a plurality of electrode patches disposed on a plurality of respective regions of the actuatable material and electrically isolated from each other. The plurality of electrode patches include the first electrode patch, and the plurality of respective regions include the first region. The control unit is configured to select a subset of one or more electrode patches from the plurality of electrode patches to receive the haptic driving signal to actuate a subset of one or more respective regions of the plurality of regions of the actuatable material. The one or more selected electrode patches include the first electrode patch, and the one or more actuated regions include the first region.

In an embodiment, when the haptic driving signal is applied to the selected one or more electrode patches to actuate the one or more respective regions of the actuatable material, other regions of the actuatable material outside the one or more respective regions are not actuated.

In an embodiment, the control unit is configured to cause unselected electrode patches of the plurality of electrode patches to be electrically grounded to prevent the respective regions corresponding to the unselected electrode patches from actuating.

In an embodiment, the actuatable material of the actuation layer covers all or substantially all of a front side of the display layer.

In an embodiment, the actuatable material of the actuation layer is an electroactive polymer that includes at least vinylidene fluoride (VDF), trifluoroethylene (TrFE), and chlorofluoroethylene (CFE), and has a thickness that is in a range of 5 µm to 30 µm, wherein the actuatable material is configured to deform inwardly at the one or more respective regions, in a range of 1 µm to 5 µm, to form one or more respective recesses upon the difference in electrical potential being applied.

In an embodiment, the first electrode layer is formed of a single piece of conductive material that has substantially the same area as the actuatable material of the actuation layer, and has a transparency level of at least 80%.

In an embodiment, the plurality of electrode patches is arranged as one of a line and a two-dimensional array of electrode patches.

In an embodiment, at least one electrode patch of the plurality of electrode patches has a rectangular shape, and wherein a length or a width of the at least one electrode patch is in the range of 1 mm to 5 mm.

In an embodiment, the control unit is configured to select the one or more electrode patches by selecting one or more locations on a surface of the haptic-enabled device at which to output a haptic effect, and to select one or more respective electrode patches closest to the one or more locations.

In an embodiment, the one or more locations selected by the control unit include a location on the surface of the haptic-enabled display device at which a touch input is received.

In an embodiment, the one or more locations selected by the control unit may include locations surrounding a location at which a touch input is received.

In an embodiment, the haptic-enabled display device further comprises a signal generator and a multiplexer. The signal generator is configured to generate the haptic driving signal. The multiplexer is configured to multiplex the haptic driving signal to the selected one or more electrode patches based on a control signal from the control unit.

In an embodiment, the haptic-enabled display device further comprises a deformable capacitive touch-sensing layer disposed on the second electrode layer.

One aspect of the embodiments herein relate to a haptic-enabled display device comprising a display layer, a first electrode layer, an actuator patch, an electrode patch, and a control unit. The display layer has a front side configured to display an image, and a back side opposite the front side. The first electrode layer is formed of conductive material disposed on the back side of the display layer. The actuator patch forms an actuation layer and is disposed on a region of the first electrode layer and electrically connected thereto, wherein the actuator patch has an area smaller than that of the conductive material of the first electrode layer. The electrode patch forms a second electrode layer and is disposed on the actuator patch, and has an area smaller than that of the conductive material of the first electrode layer. The control unit is configured to provide a haptic driving signal to the electrode patch to actuate the actuator patch. The actuator patch has an actuatable material configured to deform upon any haptic driving signal creating a difference in electrical potential between opposite sides of the actuator patch.

In an embodiment, the actuator patch is a first actuator patch, the region at which the actuator patch is disposed is a first region, and the electrode patch is a first electrode patch. The actuation layer has a plurality of actuator patches disposed on respective regions of the first electrode layer and electrically connected thereto, wherein the plurality of actuator patches include the first actuator patch, and the respective regions include the first region. The second electrode layer has a plurality of electrode patches disposed on the plurality of actuator patches, respectively, and electrically connected thereto, wherein the plurality of electrode patches are electrically isolated from each other, and include the first electrode patch. Each electrode patch of the plurality of electrode patches has substantially the same area as a respective actuator patch.

In an embodiment, the display layer is an organic light emitting diode (OLED) layer, and the actuatable material is a macrofiber composite material having a plurality of piezoceramic fibers embedded in a polymer matrix.

In an embodiment, the first electrode layer is formed of a single piece of electrode material having substantially the same area as the display layer.

Embodiments herein relate to a method of making a haptic-enabled display device. The method comprises depositing a first electrode layer directly on a substrate or directly on a front side of a display layer. The method further comprises depositing a layer of actuatable material on all or substantially all of the first electrode layer to form an actuation layer thereon, the actuatable material configured to deform at one or more regions upon a difference in electrical potential between opposite sides of the actuation layer being created at the one or more regions. The method further comprises depositing a second electrode layer on all or substantially all of the actuation layer. The method further comprises removing material from the second electrode layer to form one or more electrode patches, each of the one or more electrode patches having an area that is smaller than that of the first electrode layer.

In an embodiment, the step of removing material from the second electrode layer comprises removing material to form a plurality of electrode patches that are electrically isolated from each other, and wherein the material of the second electrode layer is removed without removing actuatable material of the actuation layer, wherein the first electrode layer is directly deposited on the substrate, and wherein the method further comprises attaching the substrate directly to the front side of the display layer.

In an embodiment, depositing the actuatable material comprises depositing a solution having at least vinylidene fluoride (VDF), trifluoroethylene (TrFE), and chlorofluoroethylene (CFE).

One aspect of the embodiments herein relate to a method of making a haptic-enabled display device. The method comprises depositing a first electrode layer directly on a back side of a display layer or directly on a substrate. The method further comprises depositing one or more actuator stacks on the first electrode layer, each of the one or more actuator stacks having an actuator patch and an electrode patch disposed thereon, wherein the actuator patch is formed of an the actuatable material configured to deform upon a difference in electrical potential between opposite sides of the actuator patch being created.

In an embodiment, the step of depositing one or more actuator stacks comprises depositing a plurality of actuator stacks, each of the plurality of actuator stacks having a respective actuator patch formed of the actuatable material, and having a respective electrode patch disposed thereon.

In an embodiment, the display layer is an organic light emitting diode (OLED) layer, and the actuatable material is a macrofiber composite material having a plurality of piezoceramic fibers embedded in a polymer matrix In an embodiment, the second actuating layer is an electroactive polymer layer.

BRIEF DESCRIPTION OF THE DRAWINGS

The foregoing and other features and advantages of the invention will be apparent from the following description of embodiments hereof as illustrated in the accompanying drawings. The accompanying drawings, which are incorporated herein and form a part of the specification, further serve to explain the principles of the invention and to enable a person skilled in the pertinent art to make and use the invention. The drawings are not to scale.

DETAILED DESCRIPTION

Figure 1A:
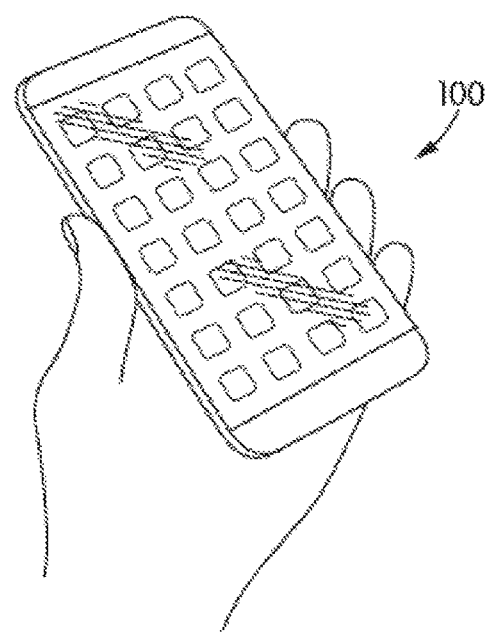
FIGS. 1A and 1B illustrate perspective views of various haptic-enabled display devices, according to embodiments hereof.

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Embodiments hereof relate to providing a display device or any other user interface device (e.g., a touchpad) with the ability to provide a localized haptic feedback (also referred to as a localized haptic effect) on a surface thereof. Such a haptic effect may be localized in that it is not output on a whole surface of the display device, but rather may be limited to a particular region of the surface. These embodiments may apply haptic feedback for, e.g., a conformed display, such as a display that conforms to the curves on the dashboard or center console of a vehicle. The use of an actuator such as a solenoid or other type of electromagnetic actuator for such a display device may be inefficient because such an actuator may be sub-optimal in terms of size and power consumption. Thus, embodiments herein relate to using a thin film actuator for providing, e.g., a localized haptic effect at a specific region of a display device's surface. Such a localized haptic effect may be more power-efficient than moving a whole body of the display device, and may be able to convey a variety of information to a user. In embodiments hereof, the actuator may have a thin, flexible, and/or substantially transparent film or layer, which may be referred to generally as an actuation layer. Haptic feedback may be provided through deformation of the actuation layer.

In a first set of embodiments, the actuation layer may be disposed on a front of a display layer (e.g., a liquid crystal display (LCD) layer). The actuation layer may be formed from an actuatable material, such as a smart material (e.g., an electroactive polymer (EAP) material). The EAP material may include, e.g., a polymer in the polyvinylidene fluoride (PVDF) family. Such a polymer may be a homopolymer with PVDF as the only repeating unit, a copolymer (e.g., a terpolymer), or any other type of polymer. In a more specific example, the EAP material may be a P(VDF-TrFE-CFE), i.e. a polymer having vinylidene (VDF), fluoridetrifluoroethylene (TrFE), and chlorofluoroethylene (CFE). In an embodiment, the EAP or other actuatable material may be substantially transparent to visible light (e.g., a transparency level of 85% or more), so as to allow the display layer to be viewed through the actuatable material. In an embodiment, the transparency of the actuation layer may be increased by choosing a lower thickness for the actuation layer. An example thickness of the actuation layer may be on the order of microns (e.g., in a range of 5 µm to 30 µm) or millimeters. The amount of deformation of the actuation layer may also be on the order of microns or millimeters, and may be sufficient for tactile perception.

In an embodiment, the localized haptic effect for the display device is provided not with a plurality of discrete and separate pieces of EAP or other actuatable material, but with an actuation layer formed of a single piece of EAP material. Using a single piece of actuatable material for the actuation layer may simplify the manufacturing process for a haptic-enabled display device. By comparison, a process that makes a haptic-enabled device by disposing several discrete and separate pieces of EAP material on various regions of a display layer may involve a greater number of steps, and may in general be more complicated, thus lowering manufacturing efficiency.

In an embodiment, the single piece of EAP material that form an EAP layer may be configured to provide one or more localized haptic effects by having an electrode layer deposited thereon, and having the electrode layer patterned into a plurality of electrode patches disposed at respective regions of the EAP material. Each electrode patch may be used to deform the EAP material at a region of the EAP material at which the electrode patch is disposed. For instance, the surface of the EAP material may be electrode-deposited with a patterned format to provide haptic feedback. Another electrode layer may be disposed on the opposite side of the EAP material to function as an electrical ground electrode. Both electrode layers may also be substantially transparent. In an embodiment, the EAP layer and the two electrode layers may make up a haptic-enabled layer. In an embodiment, the haptic-enabled layer may be an external or outer layer mounted on an exterior (i.e., outer) surface of a display layer of the display device. In an embodiment, the haptic-enabled layer may further include a protective layer (e.g., insulator layer) or other layer that covers all of the other layers of the display device. During use of the display device, the haptic-enabled layer may receive contact from a user.

In an embodiment, the haptic-enabled layer may be manufactured or otherwise formed through one or more deposition steps. For example, an actuatable material, such as a transparent polymer comprising P(VDF-TrFE-CFE), may be placed in a solution state by dissolving the polymer in a proper solvent. The solution may then be deposited on a surface or substrate of interest. The surface or substrate may already have a thin and transparent first electrode layer thereon (e.g., in a simple or patterned way). In an embodiment, this electrode layer may later be used as a ground electrode. The solution may be deposited on the substrate via a film applicator or a spin coating step, and then annealed at a certain temperature (e.g., 80° C. to 120° C.) to form an actuation layer. Then, a transparent second electrode layer may be deposited on the actuation layer in a desired pattern (e.g., as a plurality of electrode patches). The pattern may depend on a desired actuation for a surface of the display device. For instance, the surface of the display device may be divided into different zones, and a particular pattern may be devoted to each zone. As another example, the second electrode layer may remain unpatterned, and may be used to cause the entire actuation layer to deform, so as to provide haptic actuation on the whole surface of the display device.

In a second set of embodiments, discrete actuator patches may be disposed on a back side (also referred to as a rear side) of a display layer of a display device. The discrete actuator patches may be able to provide localized haptic feedback for the display device. In an embodiment, the display layer of the display device may be an organic light emitting diode (OLED) type display layer, which may have fewer layers inside its structure compared to other types of display layers. As a result, the OLED-type display layer may exhibit less dampening of, e.g., a vibration output by one or more of the actuator patches. The reduced dampening better allows vibration generated by the one or more actuator patches to propagate from the back side of the display layer to the front of the display layer to create a vibrotactile haptic effect on or near a front surface thereof. Thus, the use of the OLED-type display layer may complement the placement of the actuator patches on the rear side of the display layer. In an embodiment, each of the actuator patches may be made of a thin microfiber composite (MFC) or other type of piezoceramic material. The MFC material may include a plurality of piezoceramic fibers embedded in a polymer matrix (e.g., an adhesive matrix). The MFC material may be sandwiched between two electrodes. The piezoceramic fibers may extend to two opposite surfaces of the polymer matrix, so as to make electrical contact with the two electrodes and be electrically connected thereto. The MFC material and the electrodes may together be bonded to the back side of the OLED-type display layer.

In an embodiment, each actuator patch may cover an effective actuation area (also referred to as a region or section) corresponding to an area of the display device at which vibration from the actuator patch can be perceived effectively. The distance between two actuator patches may be controlled/determined by the effective actuation area covered by each actuator patch. For instance, a front surface of the display device may be divided into sections. The sections may cover the entire front surface of the display device, or may cover an area of the display device at which the user provides most of his or her user interactions. Respective actuator patches may be placed behind the display layer of the display device at locations corresponding to those sections of the front surface. As a result, the user receives haptic feedback when he or she interacts with those sections of the surface of the display device. For instance, each actuator patch may be placed behind a center of a corresponding section of the front surface. In an embodiment, each of the actuator patches may be responsible for a respective section of the front surface of the display device. In an embodiment, a combination of actuator patches (e.g., a combination of actuator patches arranged as a star or a wheel, depending on the type of actuation that is needed) may be responsible for a particular section of the front surface of the display device.

In an embodiment, the number and layout of the actuator patches may depend on a configuration of the display device and one or more boundary conditions. Techniques such as finite element analysis can be used to determine the optimal number of actuator patches to use, and their optimal layout (e.g., optimal distance between the actuator patches).

Figure 1B:
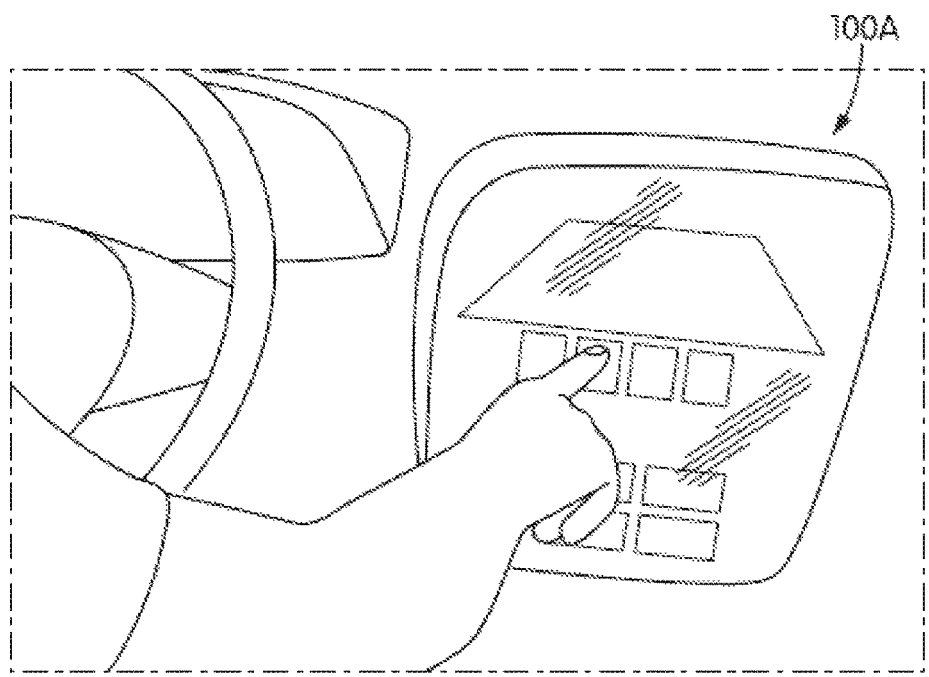

FIGS. 1A and 1B illustrate two haptic-enabled display devices 100/100A of the embodiments hereof. In FIG. 1A, the haptic-enabled display device 100 may be a handheld display device, such as a mobile telephone or other type of portable computer. FIG. 1A further illustrates various apps being displayed on the mobile telephone. In FIG. 1B, the haptic-enabled display device 100A may be a display device mounted at or near a center console of a vehicle, to the right of the steering wheel. In an embodiment, the haptic-enabled display device 100A may have a curved surface that conforms to a curved surface of the center console.

Figure 1C:
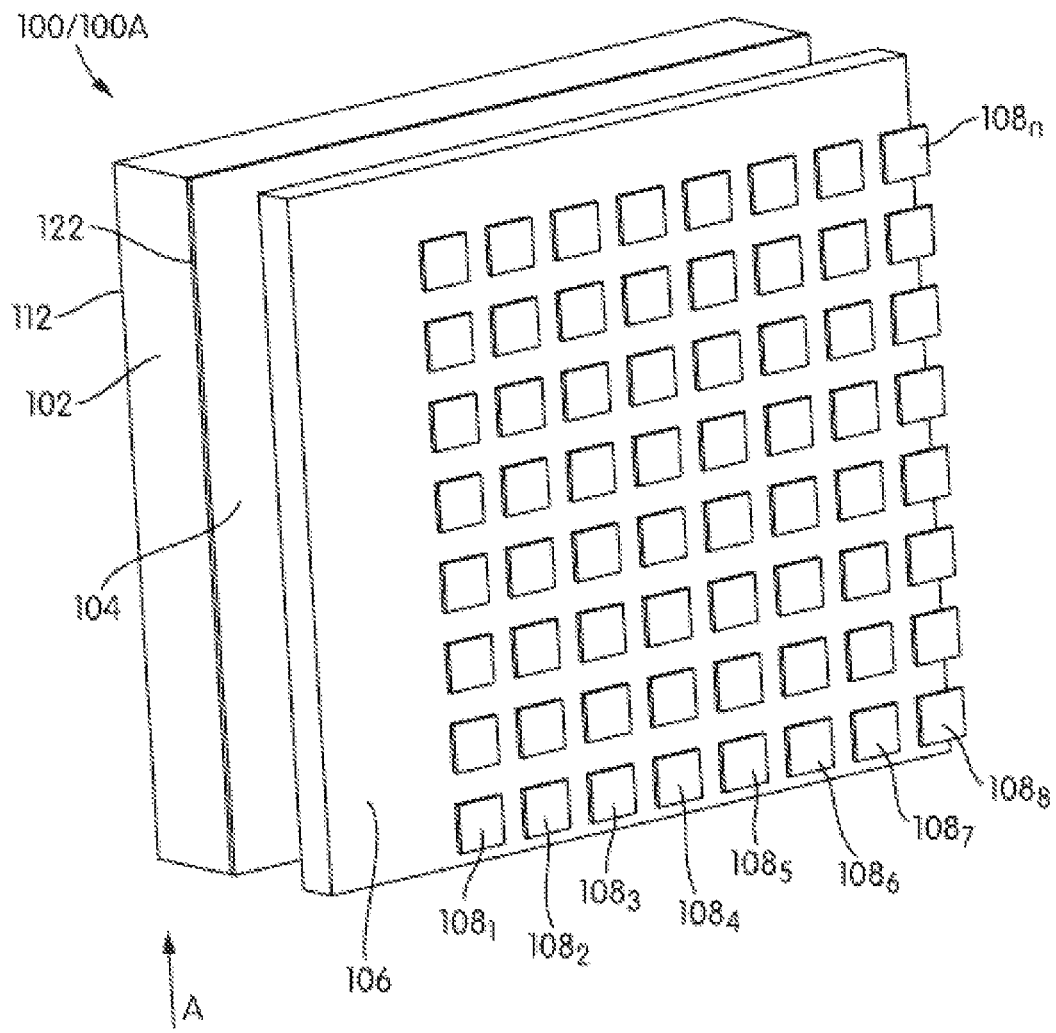
FIG. 1C illustrates a perspective view of various layers of a haptic-enabled display device, according to an embodiment hereof.

FIG. 1C illustrates a perspective view of various components of a haptic-enabled device, such as device 100 or 100A. As depicted in the figure, haptic-enabled display device 100/100A may include a display layer 102, a first electrode layer 104, an actuation layer 106 (e.g., insulation layer), and a plurality of electrode patches $108_1$, $108_2$, $108_3$, $108_4$, $108_5$, $108_6$, $108_7$, $108_8$, ... $108_n$ that form a second electrode layer. The display layer 102 may be, e.g., a liquid crystal display (LCD) layer an OLED layer, or any other type of display layer. Further, the display layer 102 may have a front side 122 (also referred to as front surface) through which an image is shown, and a rear side (also referred to as a back side) 112 that is an opposite side of the display layer 102.

As depicted in FIG. 1C, the first electrode layer 104, the actuation layer 106, and the plurality of electrode patches $108_1$, $108_2$, $108_3$, ... $108_n$ may form a haptic-enabled layer that is disposed on the front side 122 of the display layer. In FIG. 1C, the plurality of electrode patches is arranged as an 8×8 array of electrode patches (i.e., n=64). In other embodiments, the plurality of electrode patches may be arranged differently (e.g., as a series of concentric rings). FIG. 1C further depicts the actuation layer 106 being formed of a single piece of actuatable material (e.g., P(VDF-TrFE-CFE) or another type of smart material). In an embodiment, the single piece of actuatable material of the actuation layer 106 is continuous and substantially uniform throughout the piece. In an embodiment, the single piece of actuatable material of the actuation layer 106 has substantially the same area as a conductive material forming the first electrode layer 104. In an embodiment, each electrode patch of the electrode patches $108_1$ to $108_n$ may have an area that is smaller than that of the single actuatable material and smaller than that of the conductive material of the first electrode layer 104. The plurality of electrode patches $108_1$ to $108_n$ may be electrically isolated from each other by having an insulating material or gap between the electrode patches. While FIG. 1C depicts an embodiment having a plurality of electrode patches $108_1$ to $108_n$ electrically connected to a plurality of respective regions of the actuatable material of the actuation layer 106, the haptic-enabled display device in another embodiment may have a second electrode layer that has only a single electrode patch, which is electrically connected to a region of the actuatable material. The electrode patch may also have an area that is smaller than that of the single piece of actuatable material, and smaller than that of the conductive material of the first electrode layer.

Figure 2A:
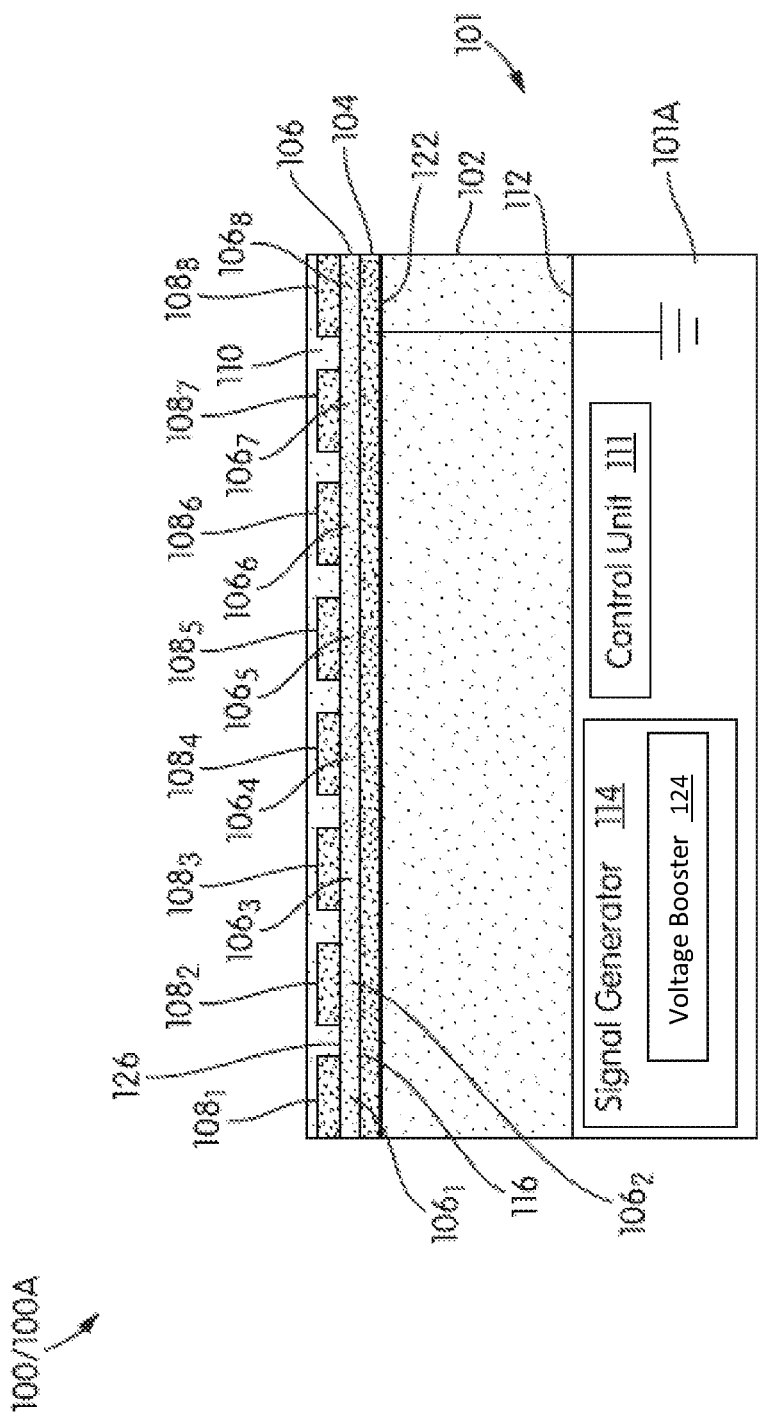
FIGS. 2A, 2B, and 3 illustrate respective side views of embodiments of a haptic-enabled display device, according to embodiments hereof.
Figure 2B:
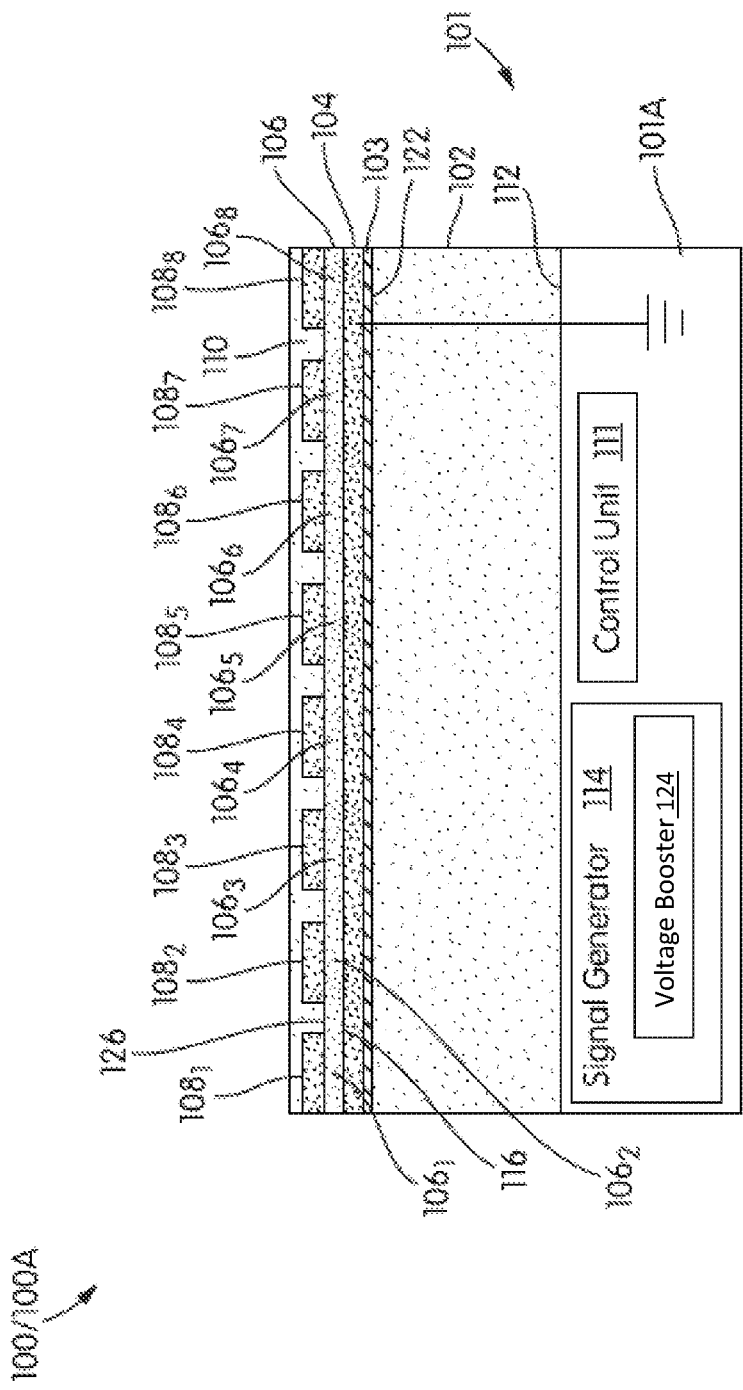

FIGS. 2A and 2B illustrate respective side views of two embodiments of the haptic-enabled display device 100/100A, as viewed in the direction of the arrow A of FIG. 1C. Like in FIG. 1C, FIGS. 2A and 2B also depict the first electrode layer 104, the actuation layer 106, and a row of electrode patches $108_1$ to $108_8$ of the second electrode layer. The first electrode layer 104, the actuation layer 106, and the second electrode layer are collectively disposed on a front side 122 of the display layer 102. In FIG. 2A, the first electrode layer 104 may be disposed directly on the front side 122 of the display layer 102, such that it is in contact with the front side 122. In FIG. 2B, the first electrode layer 104 may be disposed directly on a substrate 103 (e.g., an electrically insulating substrate), which is in turn disposed directly on the front side 122 of the display layer 102. As discussed later in the disclosure with respect to a method of making a haptic-enabled device, the substrate 103 may be used in one embodiment as a substrate on which the first electrode layer 104, actuation layer 106, and second electrode layer are disposed. The substrate 103 may then be attached to the display layer 102 to form a haptic-enabled display device. The substrate 103 may thus allow the first electrode layer 104, the actuation layer, and the second electrode layer to be formed separate from the display layer 102, and then mounted on the display layer 102.

FIGS. 2A and 2B further show a housing 101, such as a casing, that has a space 101A that houses various components of the display device 100/100A. The components include, e.g., a control unit 111 and a signal generator 114. In an embodiment, the display layer 102 may be considered to be housed by the housing 101. In an embodiment, the display layer 102 may be considered to form part of the housing 101.

FIGS. 2A and 2B further illustrate a protective layer 110 (e.g., an insulator layer) disposed at least partially over the plurality of electrode patches $108_1$ to $108_n$. The protective layer 110 may be the layer that receives contact from a user's finger or other body part. The protective layer 110 may be sufficiently flexible, such that deformation of a region of the actuation layer 106 will also cause deformation of the protective layer 110. In an embodiment, a plurality of internal touch sensors (e.g., capacitive touch sensors) may be embedded in the protective layer 110. In another embodiment, the protective layer 110 may be omitted.

In an embodiment, first electrode layer 104 may include a substantially transparent conductive material, such as indium tin oxide. In an embodiment, a material may be considered to be substantially transparent if it has a transparency of 50% or higher. In an embodiment, the first electrode layer 104 may have a higher transparency level than 50% (e.g., 80%, 85%, 90%, etc.).

FIGS. 2A and 2B further illustrate a first side 116 of the actuation layer 106 (e.g., a rear side) being disposed on and electrically connected to the first electrode layer 104. Thus, the first side 116 of the actuation layer 106 may have the same electrical potential as the conductive material of the first electrode layer 104. In an embodiment, the first electrode layer 104 may be a ground electrode that is electrically connected to a ground potential, as depicted in FIGS. 2A and 2B. In such an embodiment, the entire first side 116 of the actuation layer, or at least a portion of the first side 116 in contact with the first electrode layer 104, may also be at the ground potential.

FIGS. 2A and 2B further illustrate electrode patches $108_1$-$108_8$ of the plurality of electrode patches $108_1$-$108_n$ forming a second electrode layer, and disposed on a second and opposite side 126 of the actuation layer 106. As depicted in FIGS. 2A and 2B, the plurality of electrode patches $108_1$-$108_8$ are disposed on the single piece of actuatable material that forms the actuation layer 106. Further, the plurality of electrode patches $108_1$-$108_8$ are electrically connected to a plurality of respective regions $106_1$-$106_8$ of the actuatable material, and are electrically isolated from each other by having an insulating material or gap between the electrode patches. The electrical isolation allows a haptic driving signal to be applied to only a subset of the plurality of electrode patches $108_1$-$108_8$ (e.g., only to electrode $108_2$).

In FIGS. 2A and 2B, the signal generator 114 may be configured to generate a haptic driving signal. The haptic driving signal may be, e.g., a DC signal or an oscillating signal (e.g., a sinusoidal signal having a frequency of 100 Hz to 250 Hz). In an embodiment, the signal generator 114 includes a voltage booster 124, which may be configured to ensure that the haptic driving signal has a sufficiently high amplitude. For instance, the display device 100/100A may have a power source (e.g., battery) that provides a voltage difference of 5 V, while actuatable material such as an EAP material may need a voltage difference of, e.g., 1 kV to 10 kV to exhibit a sufficient amount of actuation. The voltage booster 124 may include, e.g., a circuit that uses an inductor, diode, and/or switch to step up the power source voltage (e.g., 5V) to the range of 1 kV to 10 kV.

In an embodiment, the control unit 111 may be configured to provide a haptic driving signal to an electrode patch (e.g., electrode patch $108_2$) to actuate a region (e.g., $106_2$) of the actuatable material at which the electrode patch is disposed. The actuatable material may be configured to deform at the region (e.g., $106_2$) at which the electrode patch is disposed upon the haptic driving signal creating a difference in electrical potential between the first and second sides (e.g., 116 and 126) of the actuation layer 106 at the region. In an embodiment, when a haptic driving signal is applied to an electrode patch (e.g., $108_2$) to actuate a respective region (e.g., $106_2$), other regions (e.g., $106_1$ and $106_3$ through $106_8$) of the actuatable material outside the respective region do not experience a difference in electrical potential, and thus are not actuated. For instance, the other electrode patches (e.g., $108_1$ and $108_3$ through $108_8$) may be grounded or left in an electrically floating state, and are not receiving any haptic driving signal, thus leaving corresponding regions of the actuatable material unactuated.

In an embodiment in which a plurality of electrode patches (e.g., $108_1$ to $108_8$) are disposed on a plurality of respective regions ($106_1$ to $106_8$) of the actuatable material, such as that illustrated in FIGS. 2A and 2B, the control unit may be configured to select a subset of one or more electrode patches (e.g., $108_2$) to receive the haptic driving signal, and to provide the haptic driving signal to the selected one or more electrode patches to actuate a subset of one or more respective regions (e.g., $106_2$) of the plurality of regions $106_1$ to $106_8$ of the actuatable material. The actuatable material (e.g., EAP) material of the actuation layer 106 may be configured to deform at the one or more respective regions upon the haptic driving signal creating a difference in electrical potential between the first side 116 and the second side 126 of the actuation layer 106 at the one or more respective regions.

Figure 3:
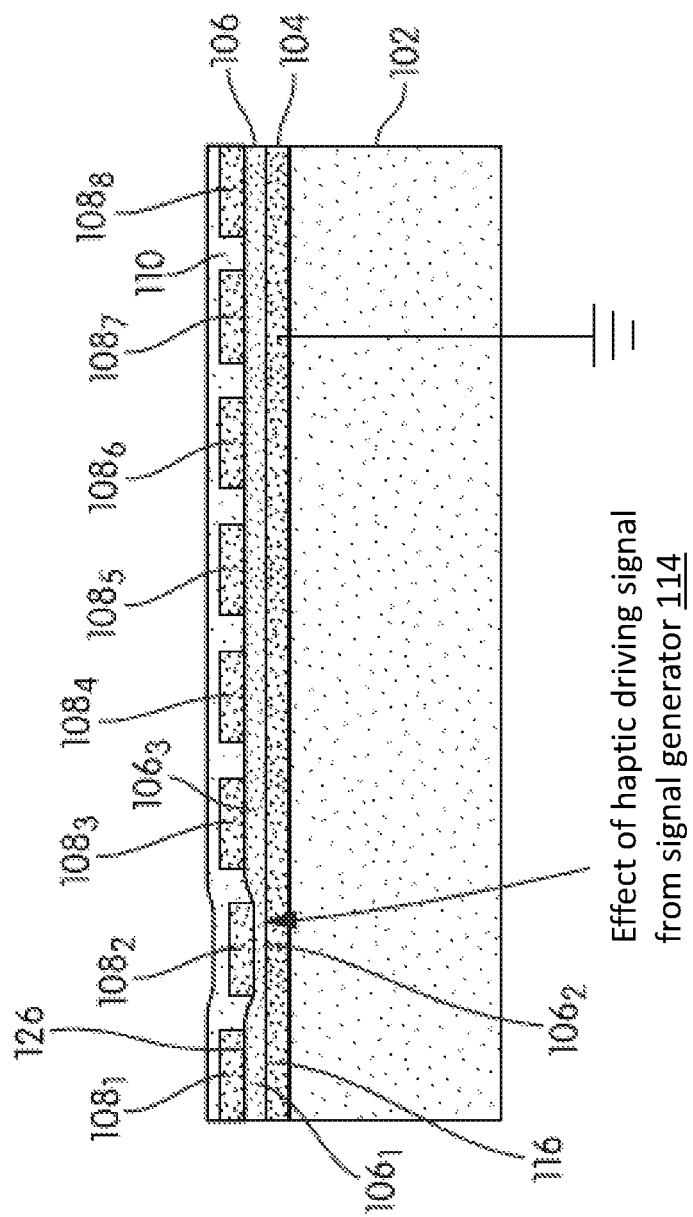

For instance, FIG. 3 illustrates an effect of a haptic driving signal being provided from the signal generator 114 to an electrode patch $108_2$. The haptic driving signal applies a first electrical potential to the electrode $108_2$, which in turn applies the first electrical potential to a respective region $106_2$ of the actuatable material at the second side 126 of the actuation layer. The region $106_2$ of the actuatable material further has a ground potential at the first side 116 of the actuation layer 106, because the first side 116 is electrically connected to the first electrode layer 104, which is acting as a ground electrode. As a result, a difference in electrical potential is created between the first side 116 and second side 126 of the actuation layer 106 at the region $106_2$ of the actuatable material. This difference in electrical potential causes the region $106_2$ to, e.g., deform inwardly to form a recess. In an embodiment, the amount of deformation may be in a range of 1 μm to 5 μm. In an embodiment, electrode patches that are not selected by the control unit control unit 111 to receive a haptic driving signal may be left in a floating state or grounded. In an embodiment, the haptic-enabled display device 100/100A may include a plurality of signal generators, and the control unit 111 may be configured to select a first subset of a plurality of electrode patches to receive a first haptic driving signal from a first signal generator, and select a second subset of the plurality of electrode patches to receive a second haptic driving signal from a second signal generator. The first subset and the second subset may be allowed to overlap in terms of the electrode patches that are selected, or may have no overlap.

Figure 4A:
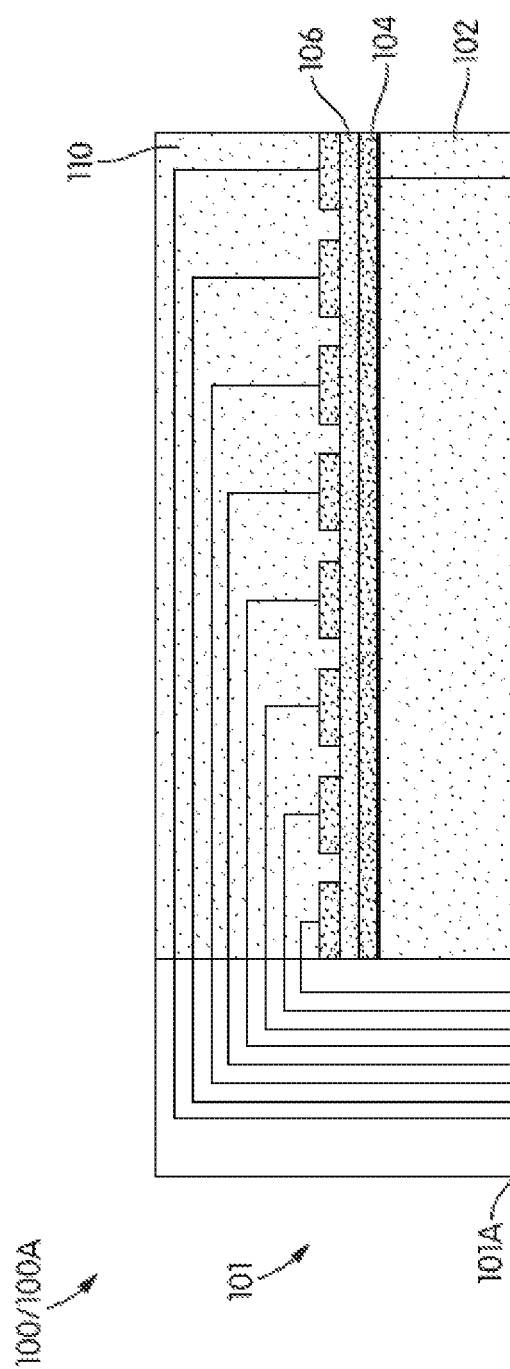
FIG. 4A illustrates a block diagram view of a control unit, signal generator, and multiplexer of a haptic-enabled display device, according to an embodiment hereof.
Figure 4B:
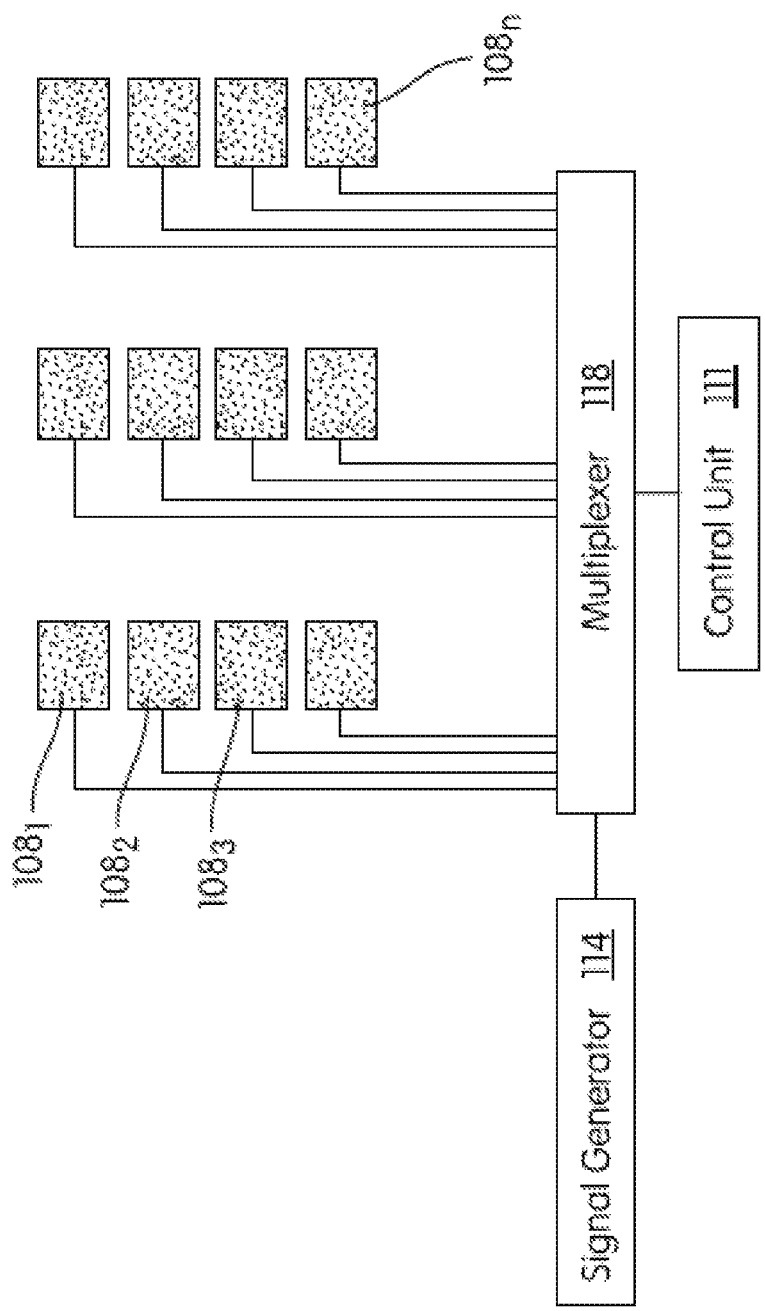
FIG. 4B illustrates a block diagram view of a control unit and a multiplexer of a haptic-enabled display device, according to an embodiment hereof.

In an embodiment, electrical connection from the signal generator 114 to the plurality of electrode patches $108_1$ to $108_8$ may be provided with thin and/or transparent conductive traces that reach the electrode patches $108_1$ to $108_8$ through the protective layer 110, as illustrated in FIG. 4A. More specifically, FIG. 4A depicts the output of the signal generator 114 being connected to a multiplexer 118. The multiplexer 118 may be configured to multiplex a haptic driving signal from the signal generator to one or more electrode patches selected by the control unit 111. The control unit 111 may thus control the multiplexing operation of the multiplexer 118. In an embodiment, the multiplexer may have traces (also referred to as wires) that run to respective electrode patches $108_1$ to $108_8$ through the protective layer 110. If the multiplexer 118 is disposed below the display layer 102, there may be a small amount of space 101A in the housing 101 in which the traces can run next to the display layer 102 up to the protective layer 110. The traces can be routed to the electrode patches $108_1$ to $108_n$ in a variety of ways. FIG. 4B, for instance, illustrates a schematic view that shows the traces being routed to the electrode patches $108_1$ to $108_n$.

Figure 4C:
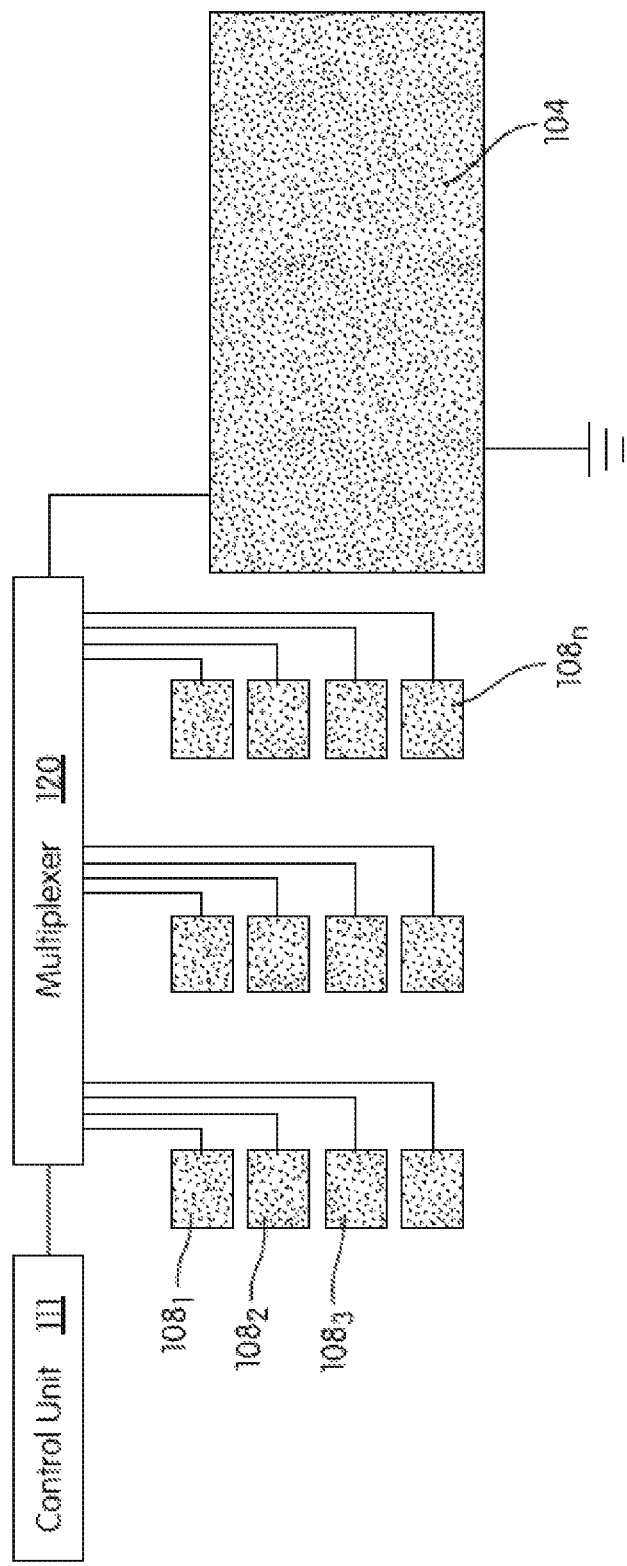
FIG. 4C illustrates a block diagram view of a control unit and a multiplexer of a haptic-enabled display device, according to an embodiment hereof.

As discussed above, certain electrode patches may be grounded when a haptic driving signal is not being routed to those electrode patches. For instance, the control unit 111 may be configured to cause unselected electrode patches of the plurality of electrode patches to be electrically grounded to prevent respective regions of the actuatable material corresponding to the unselected electrode patches from actuating. FIG. 4C illustrates a multiplexer 120 that is configured to electrically connect one or more electrode patches to a ground potential of the first electrode layer 104. The multiplexer 120 may be controlled by the control unit 111.

In an embodiment, the control unit 111 is configured to select one or more electrode patches to which to provide a haptic driving signal by selecting locations on a surface of the haptic-enabled device at which to output a haptic effect, and by selecting one or more electrode patches closest to the one or more surface locations. The surface of the haptic-enabled display device may, for example, be a surface of the protective layer 110 covering the electrode patches $108_1$ to $108_n$. In an embodiment, the one or more locations selected by the control unit includes a location at which a touch input is received. The location at which the touch input is received may be determined by, e.g., any capacitive touch sensors embedded in the protective layer 110, and/or by the actuatable material itself of the actuation layer 106. In this example, if the location at which a touch input is received is right above, e.g., electrode patch $108_2$, the control unit may select electrode patch $108_2$ as an electrode patch that receives a haptic driving signal. As a result, the control unit 111 may, for instance, control the multiplexer 118 to route a haptic driving signal to only electrode patch $108_2$.

In an embodiment, the one or more locations selected by the control unit may include locations surrounding a location at which a touch input is received. In this example, if the location at which a touch input is received is directly above, e.g., electrode patch $108_2$, the control unit may select at least electrode patches $108_1$ and $108_3$ as electrode patches that are to receive a haptic driving signal. As a result, the control unit 111 may, for instance, control the multiplexer 118 to route a haptic driving signal to at least electrode patches $108_1$ and $108_3$ (but not electrode patch $108_2$).

In an embodiment, a surface of the haptic-enabled display device 100/100A may be logically divided into different surface regions (e.g., different zones), each of which is bigger than an electrode patch. Multiple electrode patches (e.g., $108_1$ to $108_3$) and multiple respective regions (e.g., $106_1$ to $106_3$) of the actuatable material may be located under a surface region, or only a single electrode patch and a single respective region may be located under the surface region. In this embodiment, when a touch input is received at one of the surface regions, the control unit 111 may select one electrode patch or all electrode patches covered by the surface region to receive a haptic driving signal. In any of the above embodiments, the control unit may allow electrode patches that are not selected to receive the haptic driving signal to be left in a floating state, to be electrically connected to ground (e.g., via multiplexer 120), or to receive another haptic driving signal via another multiplexer and signal generator (if any).

Figure 5:
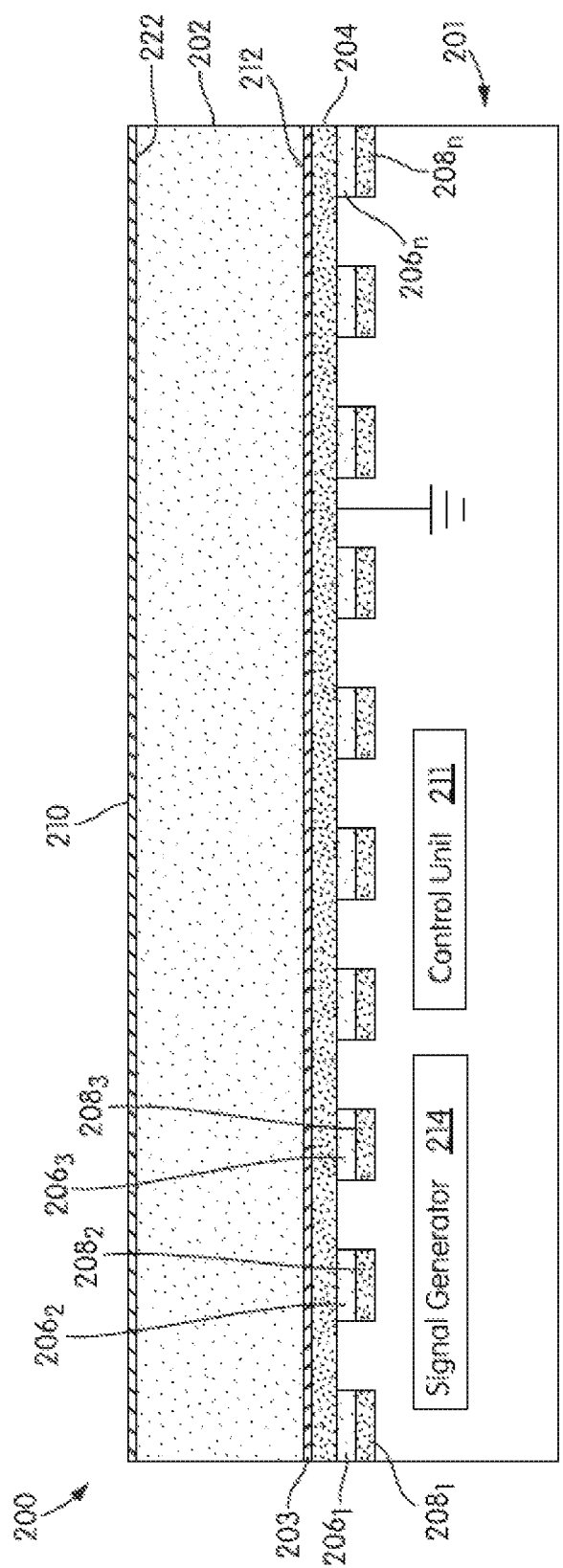
FIG. 5 illustrates a side view of a haptic-enabled display device, according to an embodiment hereof.

As discussed above, a second set of embodiments herein relate to discrete actuator patches being disposed on a back or rear side of a display layer of a display device. For instance, FIG. 5 depicts a haptic-enabled display device 200 having a display layer 202 and a plurality of actuator patches $206_1$ to $206_n$ disposed on a back side of the display layer 202. More specifically, the haptic-enabled display device 200 includes a display layer 202, a first electrode layer 204, a plurality of actuator patches $206_1$ to $206_n$, a plurality of electrode patches $208_1$ to $208_n$, a control unit 111, and a signal generator 214. In an embodiment, the haptic-enabled display device 200 may have a housing 201 that houses various components of the device 200. The display layer 202 may be housed within the housing 201, or form a part of the housing 201.

In an embodiment, the haptic-enabled device 200 may include a substrate 203 (e.g., a plastic substrate) on which the first electrode layer 204 is disposed, as depicted in FIG. 5. The substrate 203 may be used during manufacturing, to allow the first electrode layer 204, the plurality of actuator patches $206_1$ to $206_n$, and the plurality of electrode patches $204_1$ to $204_n$ to be first disposed on the substrate 203, before the substrate 203 is attached to the display layer 202. In an embodiment, the substrate 203 may be omitted from the haptic-enabled display device 200.

As illustrated in FIG. 5, the display layer may have a front side 222 configured to display an image, and a back side opposite the front side. In an embodiment, the front side 222 of the display layer 202 may be covered by a protective layer 210, as depicted in FIG. 5. The protective layer 210 may provide a front surface of the device 200. In another embodiment, such a protective layer 210 may be omitted, and the front surface 222 of the display layer 202 may also be the front surface of the overall display device 200.

In an embodiment, the first electrode layer 204 may be disposed directly or indirectly on the back side 212 of the display layer. In an embodiment, the first electrode layer 204 may be formed of a single piece of conductive material having substantially the same area as the display layer 202. In an embodiment, the plurality of actuator patches $206_1$ to $206_n$ may be disposed on respective regions of the first electrode layer 204 and electrically connected thereto. Each of the actuator patches $206_1$ to $206_n$ may have an area smaller than that of the conductive material of the first electrode layer 204. The plurality of electrode patches $208_1$ to $208_n$ may be disposed on the plurality of actuator patches $206_1$ to $206_n$, respectively, and electrically connected thereto. Each of the electrode patches $208_1$ to $208_n$ may have an area smaller than that of the conductive material of the first electrode layer 204. Further, the plurality of electrode patches $208_1$ to $208_n$ may be electrically isolated from each other. In an embodiment, each of the electrode patches and a respective actuator patch have substantially the same area.

In an embodiment, the combination of an actuator patch of the plurality of actuator patches $206_1$ to $206_n$ and an electrode patch of the plurality of electrode patches $208_1$ to $208_n$ may be referred to as an actuator stack. While FIG. 5 depicts an embodiment that has multiple actuator stacks, another embodiment may have only a single actuator stack. In either embodiment, the actuator stack or plurality of actuator stacks may be used to provide a haptic effect that is not outputted uniformly on the front surface of the device 200.

In an embodiment, each actuator patch of the plurality of actuator patches $206_1$ to $206_n$ has an actuatable material configured to deform upon any haptic driving signal creating a difference in electrical potential between opposite sides of the actuator patch. For instance, the actuatable material may be a macrofiber composite (MFC) material having a plurality of piezoceramic fibers embedded in a polymer matrix. If the first electrode layer 204 is grounded, a first side of the MFC material in contact with the first electrode layer may also have a ground electrical potential. When a haptic driving signal is applied to an electrode patch on a second and opposite side of the MFC material, a difference in electrical potential may be created that causes the MFC material to deform. In an embodiment, when the haptic driving signal is an oscillating signal, the MFC material may vibrate to generate a vibrotactile haptic effect at the front surface of the haptic-enabled device 200.

As depicted in FIG. 5, the display layer 202, by being placed in front of the actuator patches $206_1$ to $206_n$, may dampen any actuation (e.g., vibration) that propagates from the actuator patches $206_1$ to $206_n$ on the rear side 212 of the display layer 202, or completely block such actuation. Thus, in an embodiment, an OLED layer may be used as the display layer 202 when actuator patches are disposed on the rear side of the display layer 202. The OLED layer may include fewer internal components than, e.g., a LCD layer, and thus exhibit less dampening. This property better allows the vibration or other actuation generated by the actuator patches $206_1$ to $206_n$ on the rear side 212 of the display layer 202 to propagate to a front side of the display layer 202. In an embodiment, the use of the MFC material as the actuatable material and/or the use of the OLED layer as the display layer may allow actuation to be created with a few volts or tens of volts, and may avoid the amplification of a haptic driving signal. As a result, the signal generator 214 may have no voltage booster.

In an embodiment, the control unit 211 may be configured to provide a haptic driving signal to an electrode patch to actuate an actuator patch on which the electrode patch is disposed. In an embodiment having a plurality of electrode patches, the control unit 211 may be configured to select one or more electrode patches (e.g., $208_1$) from the plurality of electrode patches $208_1$ to $208_n$ to receive a haptic driving signal, and to provide the haptic driving signal to the selected one or more electrode patches (e.g., $208_1$) to actuate one or more respective actuator patches (e.g., $206_1$) of the plurality of actuator patches. In an embodiment, the control unit is configured to select the one or more electrode patches by selecting one or more locations on a surface of the haptic-enabled device at which to output a haptic effect, and to select one or more respective electrode patches closest to the one or more locations. In one instance, the one or more locations selected may include a location on the front surface of the haptic-enabled display device 200 at which a touch input is received. In an embodiment, a surface of the haptic-enabled display device 200/200A may be logically divided into different surface regions (e.g., different zones), each of which is bigger than an electrode patch. For instance, the one or more locations selected may surround a location at which a touch input is received. When a touch input is received at one of the surface regions, the control unit 211 may select one electrode patch or all electrode patches covered by the surface region to receive a haptic driving signal.

Figure 6:
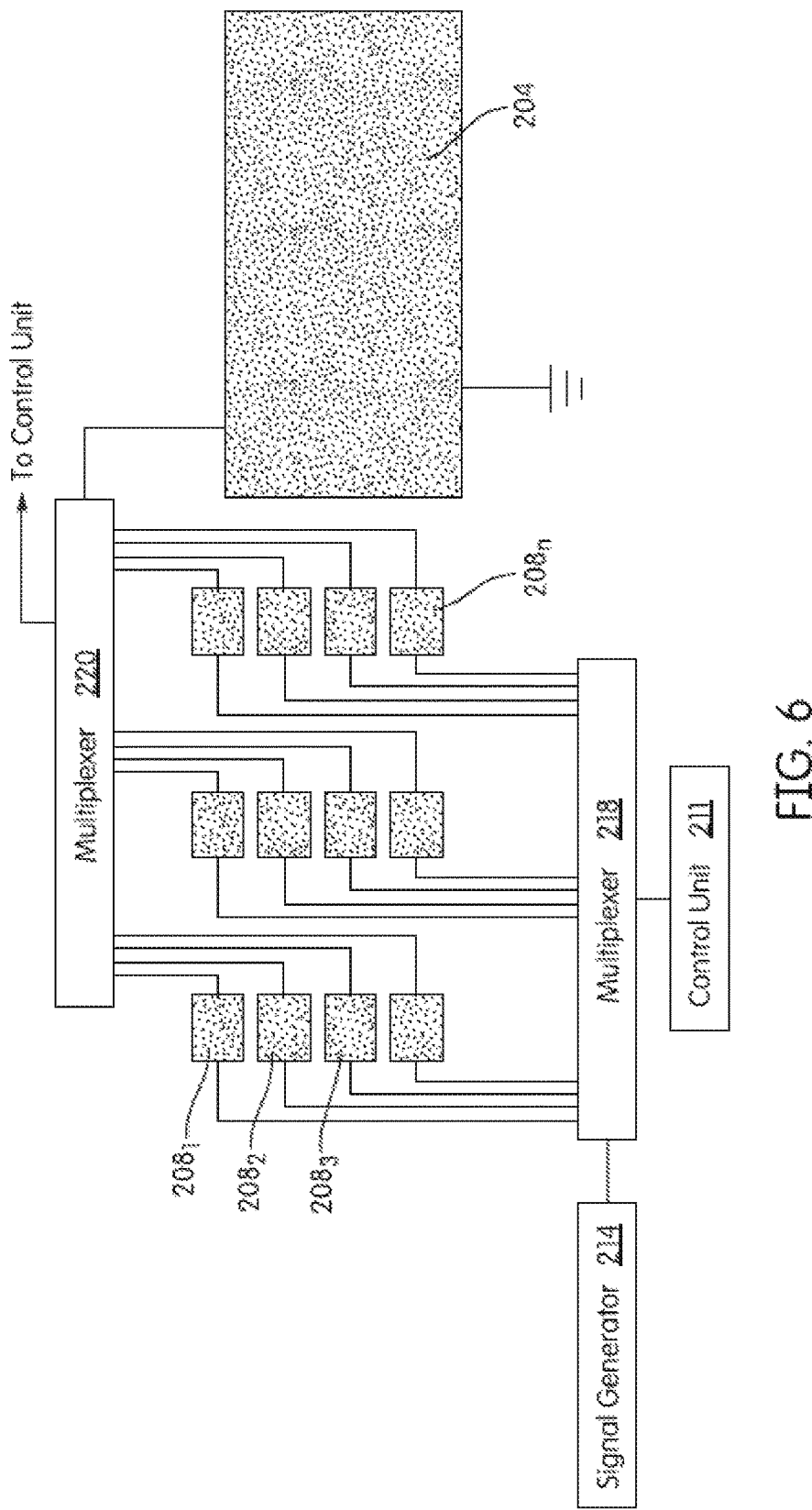
FIG. 6 illustrates a block diagram view of a control unit, signal generator, and multiplexers of a haptic-enabled display device, according to an embodiment hereof.

FIG. 6 illustrates a multiplexer 218 which may route a haptic driving signal from the signal generator 214 to a subset of one or more electrode patches (e.g., $208_1$) of the plurality of electrode patches $208_1$ to $208_n$. The multiplexer 218 may be controlled by the control unit 211. In an embodiment, another multiplexer 220 may electrically connect unselected electrode patches to a ground potential of the first electrode layer 204, as depicted in FIG. 6.

While FIGS. 4A, 4B, and 6 illustrate embodiments that include a multiplexer 118/218 configured to route a driving signal from a signal generator 114/214 to a subset of electrode patches $108_1$-$108_n$ or $208_1$-$208_n$, other embodiments may omit such a multiplexer by electrically connecting each electrode patch (e.g., each of electrode patches $108_1$-$108_n$/$208_1$-$208_n$) directly to a signal generator (e.g., signal generator 114/214). In these latter embodiments, the electrode patches (e.g., $108_1$-$108_n$/$208_1$-$208_n$) may be actuated at the same time by a driving signal from the signal generator, without multiplexing of the driving signal. If the signal generator had a single amplifier, the electrode patches may be electrically connected to the single amplifier. By omitting a multiplexer, these embodiments of a haptic-enabled device may reduce the complexity and cost of implementation for the electronics of the haptic-enabled device. In some cases, these haptic-enabled devices do not provide a touch interface or a multi-touch interface, which may reduce or eliminate the need for a multiplexer that selectively actuates individual electrode patches. In some cases, the electrode patches in these haptic-enabled devices may be left in an electrically floating state when they are not being actuated by a driving signal, thus eliminating the need for another multiplexer to selectively connect the electrode patches to a ground potential.

Figure 7:
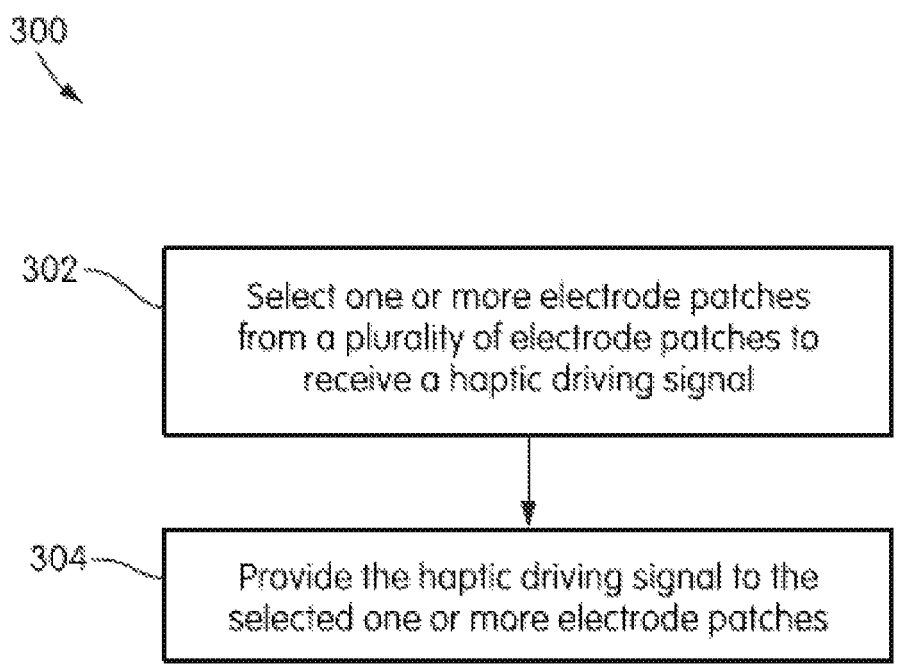
FIG. 7 provides a flow diagram that illustrates steps of a method for outputting a haptic effect at a haptic-enabled display device, according to an embodiment hereof.

FIG. 7 provides a flow diagram that illustrates a method 300 by which a control unit (e.g., control unit 111 or control unit 211) may cause a haptic effect to be output at a haptic-enabled display device. Similar to the discussion above regarding the features of the control unit 111 or 211, method 300 may include a step 302 in which the control unit 111/211 selects one or more electrode patches from a plurality of electrode patches to receive a haptic driving signal. In step 304, the control unit 111/211 may provide the haptic driving signal to the selected one or more electrode patches.

Figure 8:
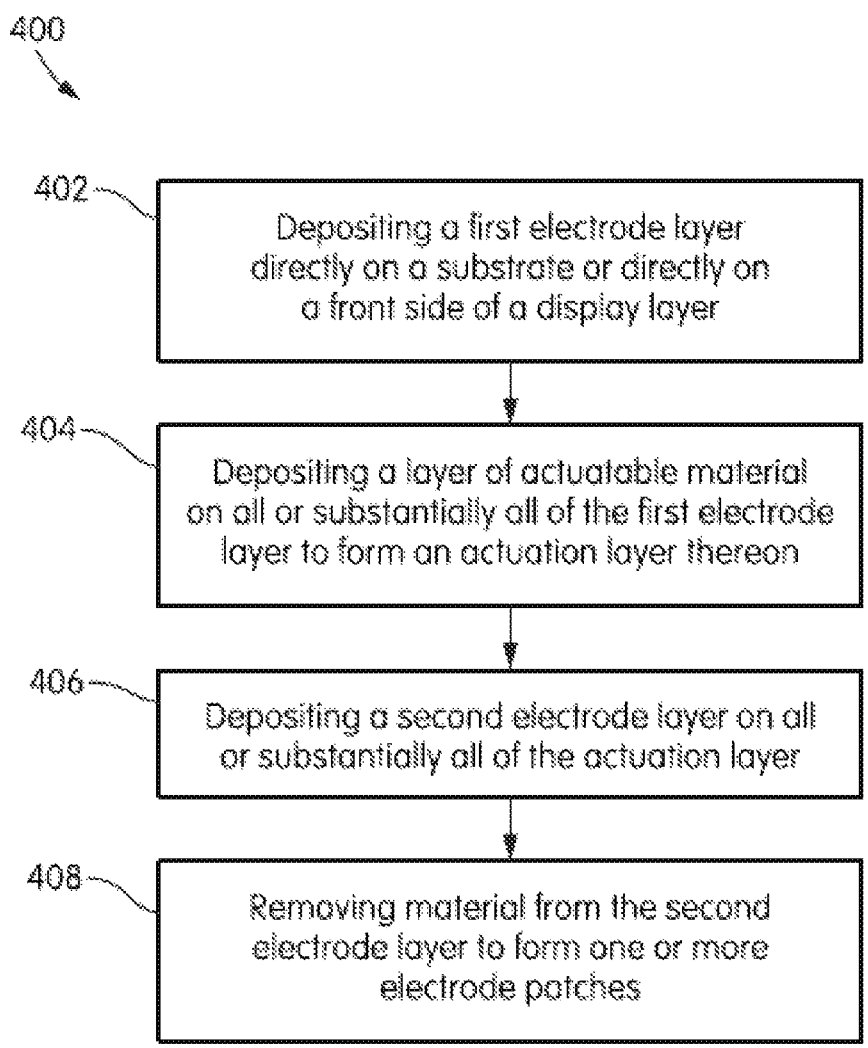
FIG. 8 provides a flow diagram that illustrates steps of a method for making a haptic-enabled display device, according to an embodiment hereof.

FIG. 8 illustrates an example method 400 for manufacturing or otherwise forming a haptic-enabled display device like that in FIG. 1 (e.g., haptic-enabled display device 100/100A). In an embodiment, the method includes a step 402 of depositing a first electrode layer (e.g., electrode layer 402) directly on a substrate (e.g., on substrate 203 in FIG. 2B) or directly on a front side of a display layer (e.g., on front side 122 in FIG. 2A). The first electrode layer may be formed from a substantially transparent conductive material. Step 402 may involve depositing the first electrode layer on a substrate as part of, e.g., pre-fabricating a haptic-enabled layer on the substrate (in steps 402 through 408) separate from the display layer, and then the substrate may subsequently be placed on the display layer. In another embodiment, the substrate may be used for a purpose other than pre-fabrication, and may be placed on the display layer before step 402 occurs. In yet another embodiment, the substrate is not involved in step 402, and the first electrode layer may be deposited directly on the display layer.

In a step 404, a layer of actuatable material may be deposited on all or substantially all of the first electrode layer to form an actuation layer (e.g., actuation layer 106) thereon. In an embodiment, this step includes depositing a solution in which the actuatable material is dissolved, such as a solution of transparent P(VDF-TrFE-CFE). The solution may be deposited on the substrate via a film applicator or a spin coating step, and then annealed at a certain temperature (e.g., 80° C. to 120° C.) to form the actuation layer.

In a step 406, a second electrode layer may be deposited on the actuation layer, such as on all or substantially all of the actuation layer. In an embodiment, the second electrode layer may also comprise transparent conductive material.

In a step 408, material from the second electrode layer may be removed to form one or more electrode patches (e.g., 108₁ to 108ₙ), where each of the one or more electrode patches has an area that is smaller than that of the conductive material of the first electrode layer (e.g., layer 104). In an embodiment, the material from the second electrode layer may be removed to form a plurality of electrode patches that are electrically isolated from each other. In an embodiment, this step may include chemically etching away conductive material of the second electrode layer to form the plurality of electrode patches. In an embodiment, a mask layer may protect the actuator layer during this removal step, such that the material of the second electrode layer is removed without removing actuatable material of the actuation layer.

In an embodiment, if step 402 is part of a pre-fabrication of a haptic-enabled layer by depositing the first electrode layer, actuation layer, and forming one or more electrode patches on a substrate, then method 400 may include another step of disposing the substrate on a front side (also referred to as front surface) of the display layer. For instance, the substrate may be bonded to the front side of the display layer.

Figure 9:
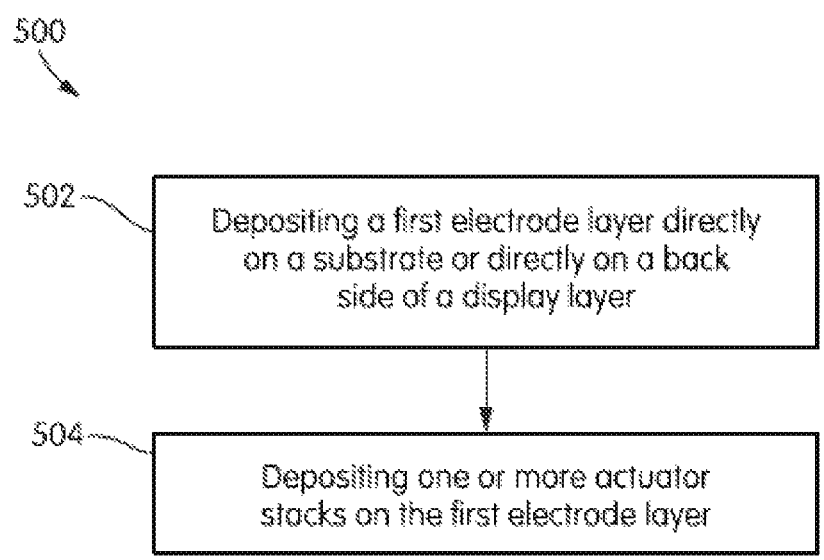
FIG. 9 provides a flow diagram that illustrates steps of a method for making a haptic-enabled display device, according to an embodiment hereof.

FIG. 9 provides a flow diagram that illustrates an example method 500 for manufacturing or otherwise forming a haptic-enabled display device like that in FIG. 5 (e.g., haptic-enabled display device 200). In an embodiment, the method includes a step 502 of depositing a first electrode layer (e.g., electrode layer 204) directly on a back side of a display layer or directly on a substrate. The first electrode layer may be formed, e.g., from a conductive material that is transparent or opaque. Like in method 800, step 802 may involve depositing the first electrode layer and other layers of a haptic-enabled layer as part of a pre-fabrication step that is separate from the display layer (though the substrate can be used even if pre-fabrication is not done, and can be deposited on the back side of the display layer before the first electrode layer is deposited), or may omit use of the substrate, such that the first electrode layer is deposited directly on the back side of the display layer.

In step 504, one or more actuator stacks may be deposited on the first electrode layer. As discussed above, each of the actuator stack may have an actuator patch and an electrode patch disposed thereon. The actuator patch may be formed of an actuatable material configured to deform upon a difference in electrical potential being created between opposite sides of the actuator patch. The actuatable material may be, for instance, a macrofiber composite material having a plurality of piezoceramic fibers embedded in a polymer matrix. In an embodiment, the one or more actuator stacks may have been pre-fabricated (e.g., the actuator patches are already bonded to respective electrode patches), and may be deposited on the first electrode layer at the same time. In an embodiment, the actuator stacks are not pre-fabricated, and the actuator patches of the actuator stacks may be deposited first, followed by subsequent deposition of respective electrode patches of the actuator stacks. In the embodiment, step 504 may involve a removal step in which electrode material and/or actuatable material is removed to form the plurality of actuator patches and electrode patches. Alternatively, step 504 may involve no such removal step.

In an embodiment, if step 502 is part of a pre-fabrication of a haptic-enabled layer by depositing the first electrode layer and one or more actuation stacks on a substrate, then method 500 may include another step of disposing the substrate on a back side (also referred to as rear side) of the display layer. For instance, the substrate may be bonded to the back side of the display layer.

While various embodiments have been described above, it should be understood that they have been presented only as illustrations and examples of the present invention, and not by way of limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the appended claims and their equivalents. It will also be understood that each feature of each embodiment discussed herein, and of each reference cited herein, can be used in combination with the features of any other embodiment.

What is claimed is:

1. A haptic-enabled display device comprising:
    a display layer;
    a first electrode layer formed of conductive material disposed on the display layer;
    an actuation layer formed of a single piece of actuatable material, wherein a first side of the actuation layer is disposed on and electrically connected to the first electrode layer, wherein the single piece of actuatable material of the actuation layer and the conductive material of the first electrode layer have substantially the same area;
    an electrode patch forming a second electrode layer and disposed on a second and opposite side of the actuation layer, wherein the electrode patch is electrically connected to a region of the actuatable material, and has an area that is smaller than that of the single piece of actuatable material and smaller than that of the conductive material of the first electrode layer; and
    a control unit configured to provide a haptic driving signal to the electrode patch to actuate the region of the actuatable material at which the electrode patch is disposed,
    wherein the actuatable material is configured to deform at the region at which the electrode patch is disposed upon the haptic driving signal creating a difference in electrical potential between the first and second sides of the actuation layer at the region.

2. The haptic-enabled display device of claim 1, wherein the electrode patch is a first electrode patch, and the region at which the electrode patch is disposed is a first region,
    wherein the second electrode layer includes a plurality of electrode patches disposed on a plurality of respective regions of the actuatable material and electrically isolated from each other,
        wherein the plurality of electrode patches include the first electrode patch, and the plurality of respective regions include the first region, and
    wherein the control unit is configured to select a subset of one or more electrode patches from the plurality of electrode patches to receive the haptic driving signal to actuate a subset of one or more respective regions of the plurality of regions of the actuatable material, wherein the selected subset of one or more electrode patches includes the first electrode patch and the subset of one or more respective regions includes the first region.

3. The haptic-enabled display device of claim 2, wherein when the haptic driving signal is applied to the selected subset of one or more electrode patches to actuate the subset of one or more respective regions of the actuatable material, other regions of the actuatable material outside the subset of one or more respective regions are not actuated.

4. The haptic-enabled display device of claim 3, wherein the control unit is configured to cause remaining electrode patches of the plurality of electrode patches, other than the selected subset of one or more electrode patches, to be electrically grounded to prevent respective regions corresponding to the remaining electrode patches from actuating.

5. The haptic-enabled display device of claim 2, wherein the actuatable material of the actuation layer covers all or substantially all of a front side of the display layer.

6. The haptic-enabled display device of claim 5, wherein the actuatable material of the actuation layer is an electroactive polymer that includes at least vinylidene fluoride (VDF), trifluoroethylene (TrFE), and chlorofluoroethylene (CFE), and has a thickness that is in a range of 5 µm to 30 µm, wherein the actuatable material is configured to deform inwardly at the subset of one or more respective regions, in a range of 1 µm to 5 µm, to form one or more respective recesses upon the difference in electrical potential being applied.

7. The haptic-enabled display device of claim 6, wherein the first electrode layer is formed of a single piece of conductive material that has substantially the same area as the actuatable material of the actuation layer, and has a transparency level of at least 80%.

8. The haptic-enabled display device of claim 2, wherein the plurality of electrode patches is arranged as one of a line and a two-dimensional array of electrode patches.

9. The haptic-enabled display device of claim 2, wherein at least one electrode patch of the plurality of electrode patches has a rectangular shape, and wherein a length or a width of the at least one electrode patch is in the range of 1 mm to 5 mm.

10. The haptic-enabled display device of claim 2, wherein the control unit is configured to select the subset of one or more electrode patches by selecting one or more locations on a surface of the haptic-enabled device at which to output a haptic effect, and to select one or more respective electrode patches closest to the one or more locations.

11. The haptic-enabled display device of claim 10, wherein the one or more locations selected by the control unit include a location on the surface of the haptic-enabled display device at which a touch input is received.

12. The haptic-enabled display device of claim 10, wherein the one or more locations selected by the control unit may include locations surrounding a location at which a touch input is received.

13. The haptic-enabled display device of claim 2, further comprising:
a signal generator configured to generate the haptic driving signal; and
a multiplexer configured to multiplex the haptic driving signal to the selected subset of one or more electrode patches based on a control signal from the control unit.

14. The haptic-enabled display device of claim 1, further comprising:
a deformable capacitive touch-sensing layer disposed on the second electrode layer.

15. A haptic-enabled display device comprising:
a display layer having a front side configured to display an image, and a back side opposite the front side;
a first electrode layer formed of conductive material disposed on the back side of the display layer;
an actuator patch forming an actuation layer and disposed on a region of the first electrode layer and electrically connected thereto, wherein the actuator patch has an area smaller than that of the conductive material of the first electrode layer;
an electrode patch forming a second electrode layer and disposed on the actuator patch, and having an area smaller than that of the conductive material of the first electrode layer; and
a control unit configured to provide a haptic driving signal to the electrode patch to actuate the actuator patch,
wherein the actuator patch has an actuatable material configured to deform upon any haptic driving signal creating a difference in electrical potential between opposite sides of the actuator patch.

16. The haptic-enabled display device of claim 15, wherein the actuator patch is a first actuator patch, the region at which the actuator patch is disposed is a first region, and the electrode patch is a first electrode patch,
wherein the actuation layer has a plurality of actuator patches disposed on respective regions of the first electrode layer and electrically connected thereto, wherein the plurality of actuator patches include the first actuator patch, and the respective regions include the first region,
wherein the second electrode layer has a plurality of electrode patches disposed on the plurality of actuator patches, respectively, and electrically connected thereto, wherein the plurality of electrode patches are electrically isolated from each other, and include the first electrode patch, and
wherein each electrode patch of the plurality of electrode patches has substantially the same area as a respective actuator patch.

17. The haptic-enabled display device of claim 16, wherein the display layer is an organic light emitting diode (OLED) layer, and the actuatable material is a macrofiber composite material having a plurality of piezoceramic fibers embedded in a polymer matrix.

18. The haptic-enabled display device of claim 15, wherein the first electrode layer is formed of a single piece of electrode material having substantially the same area as the display layer.

19. A method of making a haptic-enabled display device, comprising:
depositing a first electrode layer directly on a substrate or directly on a front side of a display layer;
depositing a layer of actuatable material on all or substantially all of the first electrode layer to form an actuation layer thereon, the actuatable material configured to deform at one or more regions upon a difference in electrical potential between opposite sides of the actuation layer being created at the one or more regions;
depositing a second electrode layer on all or substantially all of the actuation layer; and
removing material from the second electrode layer to form one or more electrode patches, each of the one or more electrode patches having an area that is smaller than that of the first electrode layer.

20. The method of claim 19, wherein removing material from the second electrode layer comprises removing material to form a plurality of electrode patches that are electrically isolated from each other, and wherein the material of the second electrode layer is removed without removing actuatable material of the actuation layer, wherein the first electrode layer is directly deposited on the substrate, and wherein the method further comprises attaching the substrate directly to the front side of the display layer.

21. The method of claim 20, wherein depositing the layer of actuatable material comprises depositing a solution having at least vinylidene fluoride (VDF), trifluoroethylene (TrFE), and chlorofluoroethylene (CFE).

22. A method of making a haptic-enabled display device, comprising:
   depositing a first electrode layer directly on a back side of a display layer or directly on a substrate; and
   depositing one or more actuator stacks on the first electrode layer, each of the one or more actuator stacks having an actuator patch and an electrode patch disposed thereon,
   wherein the actuator patch is formed of an actuatable material configured to deform upon a difference in electrical potential between opposite sides of the actuator patch being created.

23. The method of claim 22, wherein depositing the one or more actuator stacks comprises depositing a plurality of actuator stacks, each of the plurality of actuator stacks having a respective actuator patch formed of the actuatable material, and having a respective electrode patch disposed thereon.

24. The method of claim 23, wherein the display layer is an organic light emitting diode (OLED) layer, and the actuatable material is a macrofiber composite material having a plurality of piezoceramic fibers embedded in a polymer matrix.

* * * * *